United States Patent
Muto et al.

(10) Patent No.: US 9,761,407 B2
(45) Date of Patent: *Sep. 12, 2017

(54) ION BEAM DEVICE AND EMITTER TIP ADJUSTMENT METHOD

(71) Applicant: Hitachi High-Technologies Corporation, Minato-ku, Tokyo (JP)

(72) Inventors: Hiroyuki Muto, Tokyo (JP); Yoshimi Kawanami, Tokyo (JP); Hiroyasu Shichi, Tokyo (JP); Shinichi Matsubara, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/021,350

(22) PCT Filed: Oct. 8, 2014

(86) PCT No.: PCT/JP2014/076888
§ 371 (c)(1),
(2) Date: Mar. 11, 2016

(87) PCT Pub. No.: WO2015/053301
PCT Pub. Date: Apr. 16, 2015

(65) Prior Publication Data
US 2016/0225575 A1    Aug. 4, 2016

(30) Foreign Application Priority Data
Oct. 10, 2013   (JP) ................................. 2013-212426

(51) Int. Cl.
*H01J 37/26*   (2006.01)
*H01J 1/304*   (2006.01)
(Continued)

(52) U.S. Cl.
CPC .............. *H01J 37/08* (2013.01); *H01J 27/26* (2013.01); *H01J 37/1474* (2013.01);
(Continued)

(58) Field of Classification Search
CPC .......... H01J 37/261; H01J 37/08; H01J 37/26; H01J 2237/0807; H01J 1/3044; B23K 9/00
(Continued)

(56) References Cited

U.S. PATENT DOCUMENTS

| 8,847,173 B2* | 9/2014 | Kawanami | H01J 37/08 250/423 F |
| 2011/0147609 A1 | 6/2011 | Shichi et al. | |
| 2014/0299768 A1 | 10/2014 | Shichi et al. | |

FOREIGN PATENT DOCUMENTS

| JP | 7-21954 A | 1/1995 |
| JP | 2009-301920 A | 12/2009 |

(Continued)

OTHER PUBLICATIONS

International Search Report (PCT/ISA/210) issued in PCT Application No. PCT/JP2014/076888 dated Nov. 11, 2014 with English translation (Two (2) pages).
(Continued)

*Primary Examiner* — Nicole Ippolito
(74) *Attorney, Agent, or Firm* — Crowell & Moring LLP (57) ABSTRACT

The objective of the present invention is to provide an ion beam device capable of forming a nanopyramid stably having one atom at the front end of an emitter tip even when the cooling temperature is lowered in order to observe a sample with a high signal-to-noise ratio. In the present invention, the ion beam device, wherein an ion beam generated from an electric field-ionized gas ion source is irradiated onto the sample to observe or process the sample,
(Continued)

holds the temperature of the emitter tip at a second temperature higher than a first temperature for generating the ion beam and lower than room temperature, sets the extraction voltage to a second voltage higher than the first voltage used when generating the ion beam, and causes field evaporation of atoms at the front end of the emitter tip, when forming the nanopyramid having one atom at the front end of the emitter tip.

20 Claims, 4 Drawing Sheets

(51) Int. Cl.
    *H01J 37/08*     (2006.01)
    *B23K 9/00*     (2006.01)
    *H01J 27/26*     (2006.01)
    *H01J 37/147*     (2006.01)
    *H01J 37/18*     (2006.01)
    *H01J 37/285*     (2006.01)
    *H01J 37/30*     (2006.01)

(52) U.S. Cl.
    CPC ............ *H01J 37/18* (2013.01); *H01J 37/285* (2013.01); *H01J 37/3005* (2013.01); *H01J 2237/002* (2013.01); *H01J 2237/006* (2013.01); *H01J 2237/0807* (2013.01); *H01J 2237/28* (2013.01)

(58) Field of Classification Search
    USPC ........... 250/423 R, 424, 423 F, 492.1, 492.2, 250/492.21, 492.22, 492.23, 492.3
    See application file for complete search history.

(56) References Cited

FOREIGN PATENT DOCUMENTS

WO     WO 2009/147894 A1     12/2009
WO     WO 2013/054799 A1     4/2013

OTHER PUBLICATIONS

Japanese-language Written Opinion (PCT/ISA/237) issued in PCT Application No. PCT/JP2014/076888 dated Nov. 11, 2014 (Four (4) pages).

* cited by examiner

ION BEAM DEVICE AND EMITTER TIP ADJUSTMENT METHOD

TECHNICAL FIELD

The present invention relates to an ion beam device and an emitter tip adjustment method. For example, the invention relates to ion beam devices such as an ion microscope and an ion beam machining observation device, a complex device of an ion beam machining observation device and an ion microscope, and a complex device of an ion microscope and an electron microscope. The invention relates to an analysis inspection device to which an ion microscope and an electron microscope are applied. Further, the invention relates to a method for adjusting an emitter tip included in these ion beam devices.

BACKGROUND ART

The structure of the surface of a sample can be observed by irradiating the sample with an electron while scanning the electron, and detecting a secondary charged particle emitted from the sample. This is called a scanning electron microscope (hereinafter abbreviated as "SEM"). On the other hand, the structure of the surface of a sample can be observed also by irradiating the sample with an ion beam while scanning the ion beam, and detecting a secondary charged particle emitted from the sample. This is called a scanning ion microscope (hereinafter abbreviated as "SIM"). In particular, when a sample is irradiated with a light mass ion species such as hydrogen or helium, a sputtering action is relatively decreased, and therefore, it is preferred for observation of the sample.

As the ion source for an ion microscope, a gas field ionization ion source is preferred. The gas field ionization ion source is an ion source to be used as an ion beam by ionizing a gas by an electric field formed by an emitter tip. The ion source includes a gas ionization chamber having a needle-shaped emitter tip capable of applying a high voltage therein, and to the gas ionization chamber, an ionized gas is supplied from a gas source through a gas supply pipe. When the ionized gas (or a gas molecule) supplied from the gas supply pipe approaches the apex of the needle-shaped emitter tip to which a high voltage is applied so that a high electric field is applied, an electron in the gas (gas molecule) tunnels through the potential barrier lowered by the electric field, and therefore is converted to a positive ion and emitted. This is utilized as an ion beam. The gas field ionization ion source can generate an ion beam with a narrow energy width. Further, since the size of the ion generation source is small, a fine ion beam can be generated.

In order to observe a sample with a high signal-to-noise ratio by an ion microscope, it is necessary to obtain an ion beam with a high current density on the sample. Due to this, it is necessary to increase the ion radiation angle current density of a field ionization ion source. In order to increase the ion radiation angle current density, the molecular density of an ionized gas (ion material gas) in the vicinity of an emitter tip may be increased. A gas molecular density per unit pressure is inversely proportional to the temperature of a gas. Therefore, the temperature of the gas around the emitter tip may be decreased by cooling the emitter tip to an extremely low temperature. By doing this, the molecular density of the ionized gas in the vicinity of the emitter tip can be increased. It is also possible to increase the molecular density of the ionized gas in the vicinity of the emitter tip by increasing the pressure of the ionized gas in the vicinity of the emitter tip. For example, the pressure of the ionized gas around the emitter tip is from about $10^{-2}$ to 10 Pa.

PTL 1 discloses a method in which platinum is vacuum deposited onto the apex of a tungsten emitter tip, and then, platinum atoms are moved to the apex of the emitter tip under high temperature heating, whereby a pyramid structure in the order of nanometers (which is determined to be called "nanopyramid") of platinum atoms is formed, a method in which the nanopyramid is formed by field evaporating the emitter tip in vacuum, and a method in which the nanopyramid is formed by ion beam irradiation.

CITATION LIST

Patent Literature

PTL 1: WO 2009/147894

SUMMARY OF INVENTION

Technical Problem

The inventor of this application made intensive studies of the formation of a nanopyramid of an emitter tip, the following findings were obtained.

PTL 1 discloses an example in which a platinum coating film is formed on the apex of tungsten, platinum atoms are moved to the apex of an emitter tip under high temperature heating, whereby a nanopyramid having one atom at the apex, a layer of 3 or 6 atoms thereunder, and a layer of 10 or more atoms further thereunder is formed. In this method for forming a nanopyramid, the emitter tip is not always configured to have one atom at the apex. The emitter tip may have one or more, that is, a plurality of atoms at the apex in some cases. In the case where the emitter tip has a plurality of atoms at the apex, part of the plurality of atoms at the apex are blown off by field evaporation so that only one atom at the apex is left. As a result, a nanopyramid having one atom at the apex of the emitter tip is formed.

In order to observe a sample with a higher signal-to-noise ratio, the cooling temperature may be decreased. However, it was found that when the cooling temperature is decreased, the following problems occur at the time of blowing off part of the plurality of atoms at the apex of the emitter tip by field evaporation described above.

One problem is that as the cooling temperature is lower, it becomes more difficult to blow off only part of the atoms at the apex by field evaporation. As the cooling temperature is lower, a larger energy is required for blowing off the atoms at the apex by field evaporation. In the case where the cooling temperature was decreased and the bonding strength of the atoms at the apex was increased to too high, a problem that the atoms at the apex desired to be removed are not evaporated and left occurred. On the other hand, a larger energy than conventional is applied, and therefore, a problem that the plurality of atoms are all suddenly evaporated and the atom at the apex desired to be left is lost occurred.

The other problem is that as the cooling temperature is lower, a larger energy is required for blowing off the atoms at the apex by field evaporation, and therefore, a problem that electric discharge occurs between the emitter tip and an extraction electrode before the atoms at the apex are evaporated and the emitter tip itself disappears occurred.

An object of the invention is to provide an ion beam device capable of stably forming a nanopyramid having one atom at the apex of an emitter tip even when the cooling temperature is decreased for observing a sample with a higher signal-to-noise ratio.

Solution to Problem

The invention relates to an ion beam device that irradiates a sample with an ion beam generated from a gas field ionization ion source, wherein when a nanopyramid having one atom at the apex of an emitter tip is formed, the atoms at the apex of the emitter tip are field evaporated by setting the extraction voltage to a second voltage which is higher than a first voltage at which the ion beam is generated while maintaining the temperature of the emitter tip at a second temperature which is higher than a first temperature at which the ion beam is generated and lower than room temperature, whereby the atoms at the apex of the emitter tip is reduced to one.

Further, the invention relates to the ion beam device that irradiates a sample with an ion beam generated from a gas field ionization ion source, wherein the device includes a temperature increasing mechanism capable of increasing the temperature of the emitter tip cooled by a cooling mechanism when a nanopyramid having one atom at the apex of the emitter tip is formed.

Specifically, for example, by controlling the temperature of the cooled emitter tip by the temperature increasing mechanism and the cooling mechanism, the bonding strength of the atoms at the apex of the emitter tip having a plurality of atoms at the apex can be changed. The bonding strength of the individual atoms is decreased by setting the temperature of the emitter tip to a temperature which is higher than the temperature at the time of ionization of an ionized gas, and the atoms can be field evaporated one by one with a low energy at which electric discharge does not occur. As a result, only one atom which is most strongly bonded to the apex of the emitter tip can be left. The ionized gas can be extracted as an ion beam by ionizing the ionized gas even in a state where the temperature of the emitter tip is high as it is. However, due to the following reasons, the temperature increasing mechanism is stopped after one atom is left at the apex of the emitter tip, and the temperature of the emitter tip is cooled. One reason is that as the temperature of the emitter tip is lower, the bonding strength of the atom at the apex becomes higher, and therefore, the life of the atom at the apex of the emitter tip becomes longer. The other reason is that as the temperature of the emitter tip is lower, a sample can be observed with a higher signal-to-noise ratio. As the temperature of the emitter tip is lower, the temperature of a gas around the emitter tip can be decreased. A gas molecular density per unit pressure is inversely proportional to the temperature of a gas, and therefore, when the temperature of the gas around the emitter tip can be decreased, the molecular density of the ionized gas in the vicinity of the emitter tip is increased. When the molecular density of the ionized gas in the vicinity of the emitter tip is increased, the ion radiation angle current density is increased. When the ion radiation angle current density is increased, an ion beam with a high current density can be obtained on the sample. When an ion beam with a high current density is obtained on the sample, a sample can be observed with a high signal-to-noise ratio. Due to this, the temperature increasing mechanism is stopped after one atom is left at the apex of the emitter tip, and the emitter tip is cooled until the temperature of the emitter tip is decreased to the temperature at the time of ionization of an ionized gas.

In this manner, a nanopyramid having one atom at the apex of the emitter tip can be stably formed independent of the cooling temperature. Since the formation of the emitter tip is independent of the cooling temperature, the temperature at the time of ionization of an ionized gas can be decreased to a desired temperature, and thus, a sample can be observed with a higher signal-to-noise ratio.

Advantageous Effects of Invention

According to the invention, an ion beam device capable of stably forming a nanopyramid having one atom at the apex of an emitter tip even when the cooling temperature is decreased for observing a sample with a higher signal-to-noise ratio can be provided.

DESCRIPTION OF EMBODIMENTS

An ion beam device described below is sensitive to the information of the surface of a sample as compared with a device using an electron beam. This is because an excited region of a secondary charged particle is more localized on the surface of a sample than in the case of irradiation with an electron beam. Further, in the case of an electron beam, the properties as an electron wave cannot be ignored, and therefore, aberration occurs due to a diffraction effect. On the other hand, in the case of an ion beam, an ion is heavier than an electron, and therefore, a diffraction effect can be ignored.

As an ion beam device utilizing these characteristics, there is, for example, a scanning ion microscope. The scanning ion microscope is a device that observes the structure of the surface of a sample by irradiating the sample with an ion beam while scanning the ion beam and detecting a secondary charged particle emitted from the sample. In particular, when a sample is irradiated with a light mass ion species such as hydrogen or helium, a sputtering action is relatively decreased, and therefore, it is preferred for observation of the sample.

Further, by irradiating a sample with an ion beam and detecting an ion transmitted through the sample, the information reflecting the structure of the inside of the sample can also be obtained. This is called "transmission ion microscope". In particular, when a sample is irradiated with a light mass ion species such as hydrogen or helium, the ratio of an ion transmitted through the sample is increased, and therefore, it is preferred for observation of the sample.

On the other hand, the irradiation of a sample with a heavy mass ion species such as argon, xenon, or gallium is preferred for machining the sample by a sputtering action. In particular, a focused ion beam device (hereinafter abbreviated as "FIB") using a liquid metal ion source (hereinafter abbreviated as "LMIS") is known as a focused ion beam machining observation device. Further, recently, an FIB-SEM device as a complex machine of a scanning electron microscope (SEM) and a focused ion beam (FIB) is also used. In the FIB-SEM device, a square hole is formed at a desired place by irradiation with an FIB, whereby the cross section at the place can be observed with an SEM. In addition, the sample machining can be performed also by generating a gas ion of argon, xenon, or the like by a plasma ion source or a gas field ionization ion source and irradiating the sample with the gas ion.

The invention can be applied to an ion microscope, an ion beam machining observation device, a complex device of an ion beam machining observation device and an ion microscope, and a complex device of an ion microscope and an electron microscope. Further, the invention can also be applied to an analysis inspection device to which an ion microscope and an electron microscope are applied. These are collectively called "ion beam device". The ion beam device of the invention is not limited to the above-mentioned devices as long as it is an ion beam device using a gas field ionization ion source.

In an embodiment, it is disclosed that in an ion beam device that irradiates a sample with an ion beam generated from a gas field ionization ion source, the gas field ionization ion source includes an emitter tip that functions as an anode, an extraction electrode that functions as a cathode, a vacuum vessel that houses at least the emitter tip, a gas introduction section that supplies a gas through a gas introduction port to a space between an apex portion of the emitter tip and the extraction electrode, a gas exhaust section that exhausts a gas by a vacuum pump through a gas exhaust port, a cooling mechanism for cooling the gas field ionization ion source, and a temperature increasing mechanism capable of increasing the temperature of the emitter tip cooled by the cooling mechanism.

Further, in an embodiment, it is disclosed that the temperature increasing mechanism is a heater. Incidentally, the optimum value of the cooling temperature or the increasing temperature, or the optimum values of the cooling temperature and the increasing temperature varies/vary depending on an ionized gas to be used, the structure of the field ionization ion source, or the like. The temperature is not only set to two values at the time of cooling and at the time of increasing the temperature, but also is continuously changed at a given temperature gradient or changed to different temperatures in some cases.

Further, in an embodiment, it is disclosed that the gas exhaust port or the gas introduction port are provided for a structure having a ground potential.

Hereinafter, the above-mentioned and other novel characteristics and effects will be described with reference to the drawings. Incidentally, the drawings are exclusively used for understanding the invention and are not intended to limit the scope of rights.

Further, the illustration of a vacuum exhaust system that exhausts the vacuum vessel in vacuum and includes a vacuum pump, a valve, and the like, and a sample stage for placing or moving a sample is omitted.

Further, the illustration of a focusing lens, an objective lens, a beam deflector/aligner, a blanking electrode, and a power supply for the beam deflector is omitted.

Further, the illustration of an image forming section that forms an image based on a signal output from a detector is omitted.

Example 1

Figure 1:
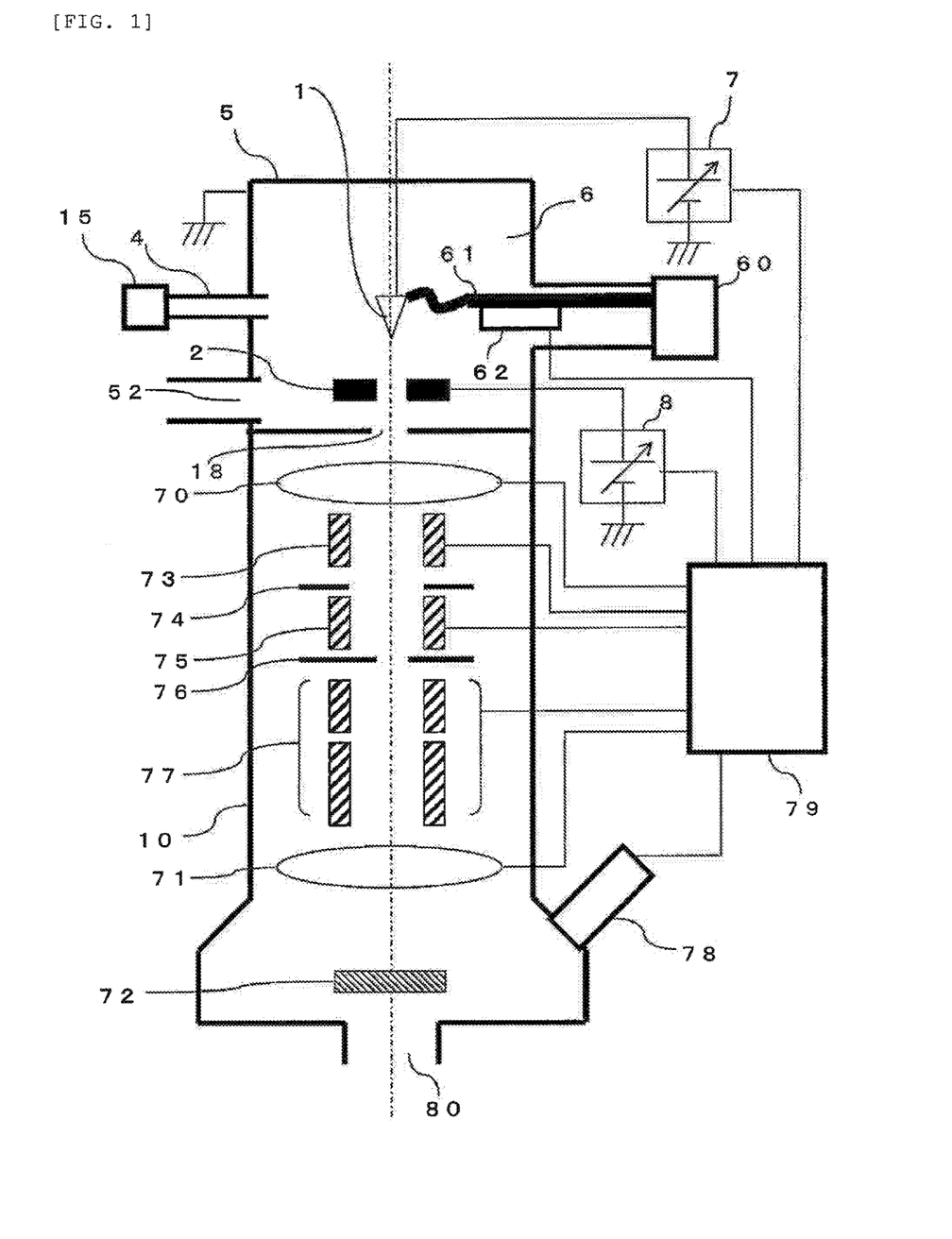
FIG. 1 is a schematic configuration view of a first embodiment of an ion beam device according to Example 1.

A first embodiment of the ion beam device will be described with reference to FIG. 1.

The ion beam device includes an ion source chamber 5 having an emitter tip 1, an extraction electrode 2, a gas supply pipe 4, a gas exhaust port 52, a cooling mechanism 60, a cooling conduction mechanism 61, and a temperature increasing mechanism 62, an ion source chamber vacuum exhaust pump (not shown) for exhausting the ion source chamber 5 in vacuum, a gas source 15 for an ionized gas, an acceleration power supply 7 that supplies a voltage to the emitter tip 1, an extraction power supply 8 that supplies a voltage to the extraction electrode 2, and a vacuum vessel 10. Incidentally, the gas supply pipe 4 and a connection port thereof to the ion source chamber 5 are collectively referred to as "gas introduction section". Further, in this example, the gas exhaust port 52 is referred to as "gas exhaust section". The ion source chamber 5 and the vacuum vessel 10 are connected to each other through an opening section 18. The ion source is a gas field ionization ion source (which is abbreviated as "gas ion source"), and supplies an ionized gas from the gas source 15 to a gas ionization chamber 6 having the emitter tip 1 in the form of a needle capable of applying a high voltage therein through the gas supply pipe 4. When an ionized gas (or a gas molecule) supplied from the gas supply pipe 4 approaches the apex of the needle-shaped emitter tip 1 to which a high voltage is applied so that a high electric field is applied, an electron in the gas (gas molecule) tunnels through the potential barrier lowered by the electric field, and therefore is converted to a positive ion and emitted. The gas ion source is an ion source that utilizes this as an ion beam.

In order to efficiently increase the temperature of the emitter tip 1 cooled by the cooling mechanism 60, it is preferred to place the temperature increasing mechanism 62 close to the emitter tip 1. In this example, the temperature increasing mechanism 62 is placed on the emitter tip 1 side of the cooling conduction mechanism 61. As the temperature increasing mechanism 62, for example, a heater or the like can be used. Therefore, the device using a heater as the temperature increasing mechanism 62 will be described. The emitter tip 1 is configured such that a platinum or iridium coating film is formed on the apex of tungsten. The emitter tip 1 is not limited to this combination, and may be, for example, a combination disclosed in PTL 1.

In the case where the cooling mechanism 60 is a mechanical freezer, a method in which as the temperature increasing mechanism 62, not a heater but a mere temperature measuring mechanism is used, and the temperature is allowed to increase naturally by stopping the cooling mechanism 60 is also employed. This method has an advantage that structures such as a heater and a heater power supply can be reduced. Which method is to be chosen depends on the intended purpose.

To the emitter tip 1, a voltage is applied by the acceleration power supply 7, and to the extraction electrode 2, a voltage is applied by the extraction power supply 8. Further, the potential of the ion source chamber 5 is fixed to a ground potential (GND) regardless of the operation of the ion beam device. The ion source chamber 5 is a vacuum vessel configured to surround the emitter tip 1. In this example, a space surrounded by this ion source chamber 5 also functions as a gas ionization chamber 6 in which a gas is ionized. In this example, the gas ionization chamber 6 refers to a structure, which is constituted by one member or a plurality of members so as to surround at least the emitter tip 1, and into which a gas is introduced.

Ions emitted from the emitter tip 1 are focused on a sample 72 by a focusing lens 70 and an objective lens 71. Between both lenses, a beam deflector/aligner 73, a movable beam limiting aperture 74, a blanking electrode 75, a blanking beam stop plate 76, and a beam deflector 77 are provided. A secondary electron emitted from the sample 72 is detected by a secondary electron detector 78. A control unit 79 controls the temperature increasing mechanism 62, the acceleration power supply 7, the extraction power supply 8, the focusing lens 70, the objective lens 71, the beam deflector/aligner 73, the movable beam limiting aperture 74, the blanking electrode 75, the beam deflector 77, the secondary electron detector 78, and the like. The control unit 79 may be constituted by a dedicated circuit board as a hardware, or may be constituted by a program to be executed by a computer (not shown) connected to the ion beam device. In this example, the vacuum vessel 10 is provided with one air exhaust port 80, but may be provided with a plurality of air exhaust ports 80.

With reference to FIGS. 1 to 4, a method for forming a nanopyramid having one atom at the apex of the emitter tip will be described.

Figure 2:
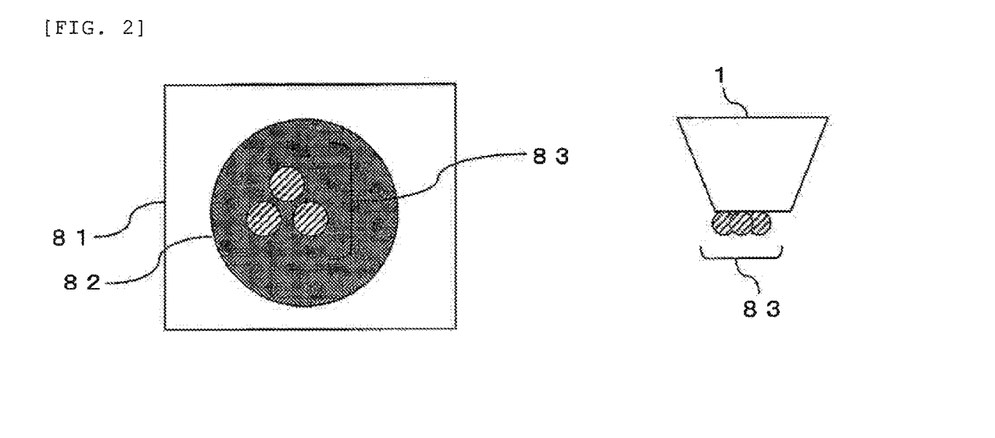
FIG. 2 is a first structure observation example of atoms at the apex of an emitter tip.

In order to observe the atomic structure of an apex portion of the emitter tip, an ion emitted from the emitter tip 1 may be scanned by the beam deflector/aligner 73. When the focused state of the ion beam is adjusted by the focusing lens 70, the atoms 83 in the apex portion of the emitter tip can be observed as in the image 81 (simulated FIM image) as shown in FIG. 2. The field of view 82 is determined by the size of the opening portion in an ion beam irradiation optical system. FIG. 2 shows an example of an atomic structure in which the apex portion of the emitter tip is composed of 3 atoms.

Figure 3:
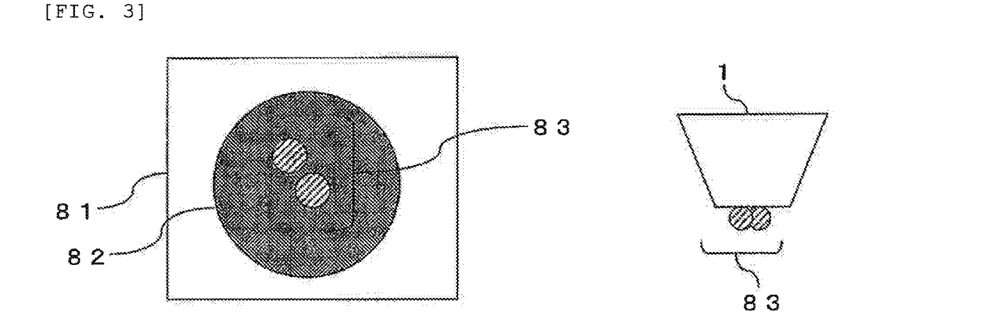
FIG. 3 is a second structure observation example of atoms at the apex of an emitter tip.
Figure 4:
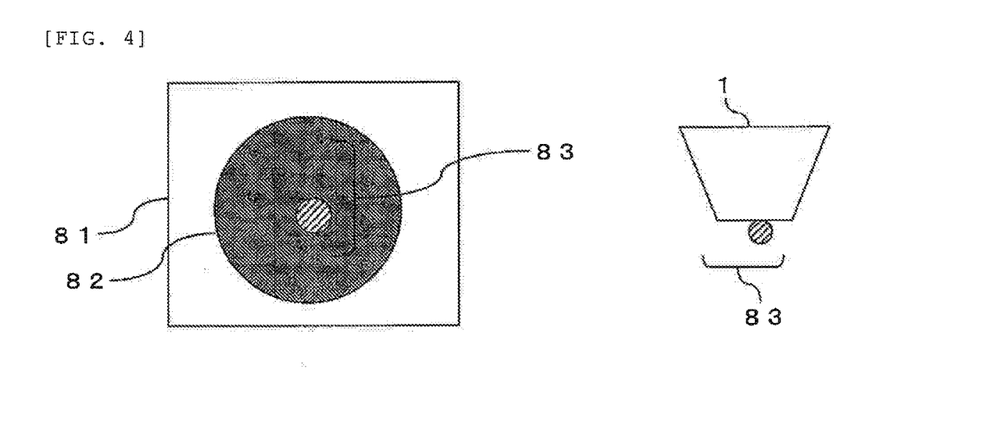
FIG. 4 is a third structure observation example of an atom at the apex of an emitter tip.

A method in which two of the three atoms present at the apex of this emitter tip 1 are blown off by field evaporation so that only one atom which is most strongly bonded to the apex of the emitter tip is left will be described. First, the temperature of the emitter tip 1 is increased to a temperature higher than the temperature at the time of ionization of an ionized gas by turning on the heater of the temperature increasing mechanism 62 to effect heating. Subsequently, the output voltage of the extraction power supply 8 is decreased, and the difference in potential between the emitter tip 1 and the extraction electrode 2 is gradually increased. As a result, an atom most weakly bonded among the three atoms in FIG. 2 is removed by field evaporation, and the atomic structure is converted to an atomic structure in which the apex portion of the emitter tip is composed of two atoms as shown in FIG. 3. When the output voltage of the extraction power supply 8 is further decreased and the difference in potential between the emitter tip 1 and the extraction electrode 2 is increased, an atom second most weakly bonded is removed by field evaporation, and the atomic structure is converted to an atomic structure in which the apex portion of the emitter tip is composed of one atom as shown in FIG. 4. Finally, the heater of the temperature increasing mechanism 62 is turned off, and the temperature of the emitter tip 1 is returned to the temperature at the time of ionization of an ionized gas. Thereafter, the output voltage of the extraction power supply 8 is adjusted so that the brightness of the image 81 (simulated FIM image) reaches the optimal value.

Example 2

Figure 5:
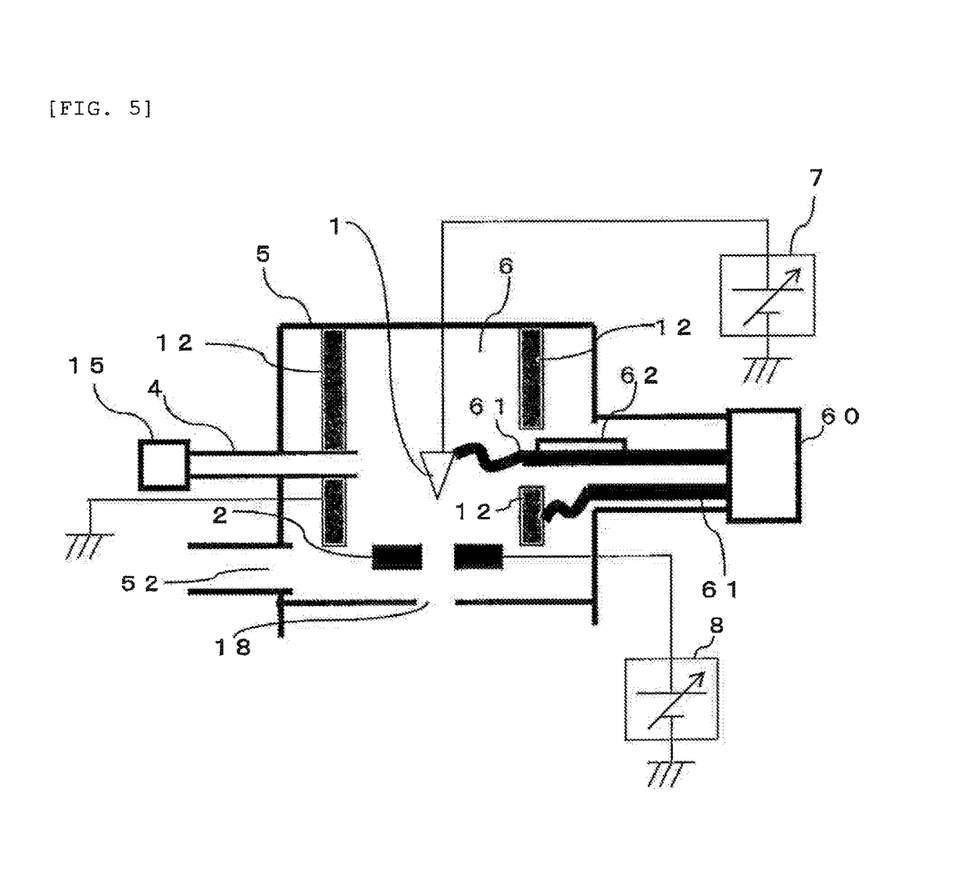
FIG. 5 is a schematic configuration view of a second embodiment of an ion beam device according to Example 2.

With reference to FIG. 5, a second embodiment of the ion beam device will be described. Incidentally, different points from Example 1 will be mainly described below, and the description of the same part will be omitted.

In FIG. 5, only an ion source chamber 5 is shown. In this example, a radiation shield 12 is provided. In this example, a space surrounded by the ion source chamber 5, a lens electrode 3, and the radiation shield 12 is a gas ionization chamber 6 in which a gas is ionized. For the radiation shield 12, a gas supply pipe 4 is provided, and also the radiation shield 12 has a GND potential. The gas supply pipe 4 may be directly fixed to the radiation shield 12, or may be fixed to another member, however, it is important that the radiation shield 12 has a ground potential (GND). The radiation shield 12 is connected to the cooling conduction mechanism 61 and cooled to a low temperature. According to this, the probability of collision of an ionized gas with the wall surface of the ion source chamber 5 at room temperature can be decreased. Therefore, the probability of increasing the temperature of the emitter tip 1 by collision of the ionized gas whose temperature is increased by collision with the wall surface of the ion source chamber 5 with the emitter tip 1 can be decreased.

Incidentally, although not shown in the drawing, a method for forming the gas ionization chamber 6 utilizing the radiation shield 12 is not limited to this example, and can be realized in various forms, for example, the radiation shield 12 which forms a closed space is provided in the ion source chamber 5 and used as the gas ionization chamber 6, or the extraction electrode 2 is also cooled, and so on.

Example 3

Figure 6:
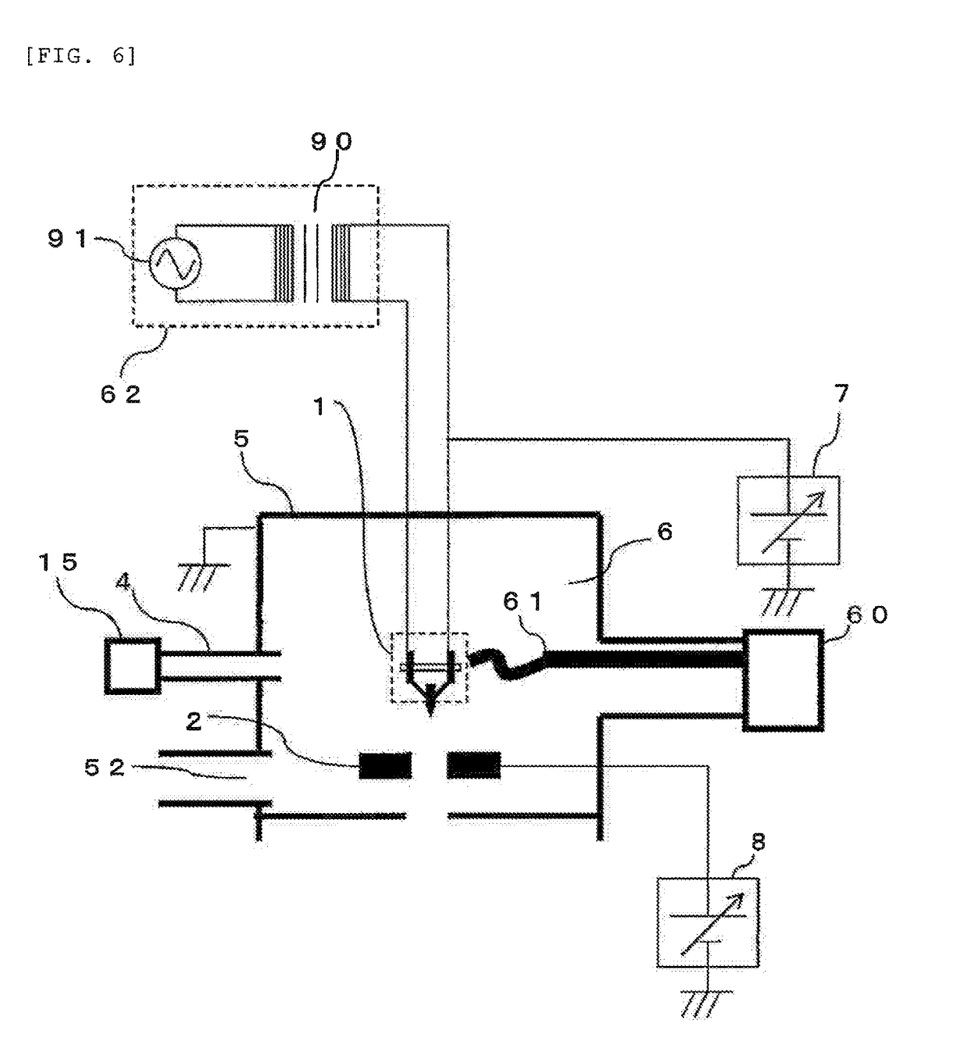
FIG. 6 is a schematic configuration view of a third embodiment of an ion beam device according to Example 3.

With reference to FIG. 6, a third embodiment of the ion beam device will be described. Incidentally, different points from Example 1 will be mainly described below, and the description of the same part will be omitted.

In FIG. 6, only an ion source chamber 5 is shown. In this example, a temperature increasing mechanism 62 is constituted by a mutual induction circuit. An emitter tip 1 is electrically heated by an AC power supply 91, a transformer 90 while maintaining insulation from the emitter tip 1. In this example, a heater component is not placed in vacuum, and therefore, a structure in vacuum which may become an impurity gas emission source can be decreased.

Incidentally, although not shown in the drawing, a configuration in which a radiation shield 12 is added as in Example 2 may be adopted.

Example 4

In this example, the invention of Example 1 will be described in more detail by adding supplementary description to Example 1.

First, a method for observing the apex of the emitter tip 1 will be described. The most common method is a method in which an ion emitted from an emitter tip is accelerated as it is, and an MCP (microchannel plate) is irradiated with the ion, and then, a light emitting pattern of a fluorescent screen on the rear side of the MCP is observed. Here, the ion is converted to an electron and light. This method is called "FIM (Field Ion Microscope)". This light emitting pattern is called "FIM image". A light emitting spot in the FIM image is derived from an individual atom at the apex of the emitter tip, and therefore, the atomic arrangement at the apex of the emitter tip can be found with the FIM image.

Here, in the ion beam device as described in Example 1, even if an MCP as described above is not newly installed, an equivalent image to the FIM image can be obtained. This image is called "simulated FIM image" or "scan FIM image". This will be described again with reference to FIG.

1. An ion beam emitted from the emitter tip 1 reaches the objective lens 71 in a state where the ion beam for each atom at the apex thereof is radiated.

If an MCP is placed on the objective lens 71, the above-mentioned FIM image is obtained. Here, an ion beam emitted from the emitter tip 1 is deflected and scanned using the beam deflector/aligner 73. The upper opening of the objective lens 71 plays a role of a diaphragm, and therefore, the intensity of the ion beam transmitted on the sample 72 side of the objective lens 71 corresponds to that when a part of the FIM image is seen with the diaphragm. The intensity of the transmitted ion beam can be measured by using a homogenous material as the sample 72 and capturing a secondary electron emitted from the material by the secondary electron detector 78. Therefore, when a two-dimensional image associated with the scan position and the intensity of the transmitted ion beam is formed using the control unit 79, this image becomes an equivalent image to the FIM image, that is, becomes a simulated FIM image or a scan FIM image. Incidentally, the area within view and the resolution vary depending on the size of the diaphragm to be used and the setting of the focusing lens 70.

Here, a method for making it easy to see the scan FIM image by adjusting the strength of the focusing lens 70 will be described. Specifically, the spread of a component emitted from an arbitrary atom in the ion beam emitted from the emitter tip 1 is made larger than the aperture diameter of the diaphragm on the objective lens 71. The reason for this is because when the spread of emission from one atom is smaller than the aperture diameter of the diaphragm, emission from an adjacent atom cannot be distinguished. That is, the resolution is insufficient. However, when the spread of emission from one atom is made large, the FIM image is magnified, and therefore, it is necessary to perform adjustment so that a necessary atom is not out of the observable area of the FIM image, which will be described with reference to the scan FIM image shown in FIG. 2. FIG. 2 shows a state where the focusing lens 70 is moderately adjusted. When the strength of the focusing lens 70 is increased from this state, the spread of the ion beam is decreased, and the size of the ion image 83 of the atoms at the apex of the emitter tip is decreased with respect to the maximum image range 81 determined by the scan range while the overlapped area is increased, and as a result, the atoms cannot be distinguished from each other. The size of the field of view 82 determined by the aperture of the diaphragm (for example, the opening of the focusing lens 70) present above the deflector is also decreased. On the other hand, when the strength of the focusing lens 70 is decreased, the spread of the ion beam is increased, and therefore, the size of the ion image 83 of the atoms at the apex of the emitter tip and the size of the field of view 82 are also increased, resulting in exceeding the maximum image range 81. Incidentally, in the common operation of this example, the strength of the focusing lens 70 is set so that the ion beams are substantially parallel to each other between the focusing lens 70 and the objective lens 71 so as to maximize the current density of the ion beam on the sample. When the FIM image is obtained as described above, the strength of the focusing lens 70 is slightly decreased.

The adjustment of the apex of the emitter tip 1 by field evaporation, that is, the removal of excess atoms is performed while observing the apex with the FIM image. Alternatively, the adjustment and the observation are alternately performed. It is preferred to repeat each of the adjustment and the observation one or more times. In order to perform field evaporation, an extraction voltage (a voltage to be applied between the emitter tip and the extraction electrode) is set higher than a so-called best image voltage (an extraction voltage under beam conditions capable of obtaining an image with the highest resolution), and therefore, the FIM image is slightly out of focus. When the extraction voltage is set to the best image voltage, the state of the atoms at the apex of the emitter tip 1 is made clear. Therefore, in the case where the adjustment by field evaporation and the observation of the FIM image are repeated, the extraction voltage may be controlled such that the voltage is set to the best image voltage during the observation of the FIM image and the voltage is set to a voltage (second voltage) which is higher than the best image voltage (first voltage) during the adjustment by field evaporation. Incidentally, an ionized gas is used in the observation of the FIM image, however, field evaporation can be performed even if the ionized gas is exhausted.

In this example, helium was used as the ionized gas. The gas pressure was set to 0.02 Pa. The temperature of the emitter tip 1 when the ion beam is generated by the present ion beam device (hereinafter referred to as "operation temperature" first temperature) was set to 40 K. This temperature is the lowest temperature to be obtained by the cooling device used in the experiment described in this example, and the highest current density of the ion beam is obtained under the conditions. On the other hand, the temperature when the excess atoms at the apex of the emitter tip 1 are removed by field evaporation was set to a temperature (second temperature) which is higher than the first temperature, specifically set to 60 K. An effect that it makes easy to remove the excess atoms even when the temperature is increased by about 10 K was obtained, however, the effect when the temperature was increased by about 20 K was made clear. However, even when the temperature was further increased, the effect was saturated. When the temperature was increased too much, the ion beam current is decreased and the FIM image cannot be observed, and therefore, it is desired to hold the increase in temperature to about 40 K. When the temperature was set to 100 K or higher, the ion beam was too weak and the FIM image could not be observed at real time. In order to simultaneously perform the acquisition of the FIM image and the adjustment by field evaporation as described above, it is necessary to set the temperature at the time of field evaporation to a temperature which is lower than the operation limit temperature of the emitter tip at which the FIM image can be acquired. Alternatively, also in the case where the acquisition of the FIM image and the adjustment by field evaporation are alternately performed, in order to eliminate the temperature switching time, it is desired to set the temperature at the time of field evaporation to a temperature which is lower than the operation limit temperature of the emitter tip at which the FIM image can be acquired.

Here, it is also possible that the FIM image is not observed simultaneously when the excess atoms are removed by field evaporation as described above. In such a case, there is no problem in principle if the temperature is increased to about room temperature. However, while a time required for an operation of removing the excess atoms is from several minutes to several tens minutes, it takes several hours to half a day to return the temperature to the operation temperature after the temperature is increased to room temperature, and therefore, it is not practical. Due to this, it is desired that the temperature when field evaporation is performed is lower than at least room temperature. After the excess atoms are removed by field evaporation without simultaneously observing the FIM image, it is desired to observe the FIM image at least once. This is because the removal may be insufficient or the atom at the apex may be lost due to excessive removal. If the removal is insufficient, it is only necessary to perform this treatment again, however, in the case where the atoms are removed excessively, it is necessary to perform a treatment that the basic form of the apex of the emitter tip is formed again.

Incidentally, the emitter tip 1 should not be made to glow (700 to 800° C. or higher) no matter what happens. This is because when the temperature exceeds 500 to 600° C., the structure at the apex is changed due to diffusion of the surface atoms. Heating at such a high temperature (third temperature) is used in the case where the basic form of the apex of the emitter tip is formed. As described in Example 1, a structure of a pyramid having one atom at the apex is formed by doing this, however, excess atoms are left at the apex stochastically, and therefore, it is necessary to perform adjustment for removing the excess atoms. The method described in this example is a method when the excess atoms which are left at the apex of the emitter tip after the basic form is established by heating at a high temperature are removed, and therefore, in this example, the emitter tip should not be heated to room temperature or higher.

Incidentally, the basic form of the apex of the emitter tip refers to the configuration and relative arrangement of a plurality of facets. The orientation is determined for each facet, and when the facets are sufficiently grown, a polyhedron is formed. The boundary between the adjacent facets forms a ridge line, and a portion where the ridge lines are crossed forms the apex.

The ion beam device of this example can also form an ion beam of helium at an operation temperature of 80 K by employing cooling with liquid nitrogen. However, at this operation temperature, a phenomenon that the excess atoms are difficult to remove did not occur. It was not until the device was tried to be used at the operation temperature which was decreased to a temperature lower than the boiling temperature of liquid nitrogen that the above-mentioned object of this application started to be addressed. In the ion beam device of this example, in order to decrease the operation temperature to a temperature lower than the temperature of liquid nitrogen, the emitter tip is cooled by a mechanical freezer having been modified so as to reduce the vibration.

Further, in the ion beam device of the example described above, in general, when the FIM image is observed or the emitter tip is adjusted by field evaporation, the gas pressure of the ionized gas is set to the same as the gas pressure when the ion beam is formed (hereinafter referred to as "operation gas pressure", first pressure). However, it was found that when combining an increase in the gas pressure to a pressure (second pressure) which is higher than the operation gas pressure with an increase in the temperature of the emitter tip as described above, the excess atoms can be removed in a shorter time. For example, by setting the gas pressure to 0.2 Pa which is one digit higher than the operation gas pressure of 0.02 Pa, the adjustment time was reduced by several times. In the case of a device in which the adjustment time for the gas pressure is short, it is preferred to use this method.

The temperature at which the excess atoms at the apex of the emitter tip are difficult to remove or the increasing temperature level necessary for improving this may depend on the type of the ionized gas. In the case where helium was used as the main component of the ionized gas as in this example, the excess atoms were difficult to remove when the operation temperature was lower than about 60 K. According to the method described above, even in the case where the operation temperature is lower than about 60 K, the excess atoms can be easily removed.

In another example, in the case where hydrogen gas was used as the main component of the ionized gas, the excess atoms were difficult to remove when the operation temperature was lower than about 50 K. The FIM image could be observed at up to 120 K. According to the method described above, even in the case where the operation temperature is lower than about 50 K, the excess atoms can be easily removed.

It is considered that the method shown in this example is effective by only changing some condition values no matter what ionized gas is used.

REFERENCE SIGNS LIST

1 Emitter tip
2 Extraction electrode
4 Gas supply pipe
5 Ion source chamber
6 Gas ionization chamber
7 Acceleration power supply
8 Extraction power supply
10 Vacuum vessel
12 Radiation shield
15 Gas source
18 Opening section
52 Gas exhaust port
60 Cooling mechanism
61 Cooling conduction mechanism
62 Temperature increasing mechanism
70 Focusing lens
71 Objective lens
72 Sample
73 Beam deflector/aligner
74 Movable beam limiting aperture
75 Blanking electrode
76 Blanking beam stop plate
77 Beam deflector
78 Secondary electron detector
79 Control unit
80 Air exhaust port
81 Image
82 Field of view
83 Atoms in apex portion of emitter tip
90 Transformer
91 AC power supply

The invention claimed is:

1. An emitter tip adjustment method, which is a method for adjusting an emitter tip in a gas field ionization ion source, which includes an emitter tip that functions as an anode, an extraction electrode that functions as a cathode, and a gas supply port for supplying a gas around the emitter tip, and generates an ion beam by ionization of the gas at a first pressure by setting an extraction voltage to be applied between the emitter tip and the extraction electrode to a first voltage in a state where the temperature of the emitter tip is set to a first temperature, wherein the atoms at the apex of the emitter tip is reduced to one by a field evaporation step in which the atoms at the apex of the emitter tip are field evaporated by setting the extraction voltage to a second voltage which is higher than the first voltage while maintaining the temperature of the emitter tip at a second temperature which is higher than the first temperature and lower than room temperature.

2. The emitter tip adjustment method according to claim 1, wherein an observation step in which an FIM image of the apex of the emitter tip is observed is further performed, and, the field evaporation step and the observation step are repeated one or more times.

3. The emitter tip adjustment method according to claim 2, wherein the second temperature is higher than the first temperature and lower than the operation limit temperature of the emitter tip capable of acquiring the FIM image.

4. The emitter tip adjustment method according to claim 3, wherein a difference between the operation limit temperature of the emitter tip capable of acquiring the FIM image and the first temperature is within 40 K.

5. The emitter tip adjustment method according to claim 2, wherein the FIM image is a two-dimensional image formed by scanning the ion beam on a diaphragm by a deflector, detecting the intensity of the ion beam transmitted through the diaphragm, and associating the scan position and the intensity of the transmitted ion beam, and is obtained by making the spread of a component emitted from an arbitrary atom of the emitter tip in the ion beam larger than the aperture of the diaphragm.

6. The emitter tip adjustment method according to claim 1, wherein the configuration and relative arrangement of facets in an apex portion of the emitter tip are formed by heating to a third temperature which is higher than room temperature.

7. The emitter tip adjustment method according to claim 1, wherein the first temperature is lower than the boiling point of liquid nitrogen.

8. The emitter tip adjustment method according to claim 1, wherein while performing the field evaporation step, the pressure of the gas is set to a second pressure which is higher than the first pressure.

9. The emitter tip adjustment method according to claim 1, wherein the main component of the gas is helium, and the first temperature is 60 K or lower, and the second temperature is 60 K or higher and lower than 100 K.

10. The emitter tip adjustment method according to claim 1, wherein the main component of the gas is hydrogen, and the first temperature is 50 K or lower, and the second temperature is 50 K or higher and lower than 120 K.

11. An ion beam device, comprising:
an emitter tip that functions as an anode;
an extraction electrode that functions as a cathode;
a gas supply port for supplying a gas around the emitter tip; and
a control section that controls the temperature of the emitter tip and the voltage of the extraction electrode, wherein
in the case where an ion beam is generated by ionization of the gas, the control section sets the temperature of the emitter tip to a first temperature and sets the extraction voltage to be applied between the emitter tip and the extraction electrode to a first voltage in a state where the pressure of the gas is set to a first pressure, and
in the case where the atoms at the apex of the emitter tip is reduced to one, the control section sets the extraction voltage to a second voltage which is higher than the first voltage while maintaining the temperature of the emitter tip at a second temperature which is higher than the first temperature and lower than room temperature, thereby field evaporating the atoms at the apex of the emitter tip.

12. The ion beam device according to claim 11, wherein the control section acquires an FIM image of the apex of the emitter tip, and repeats the field evaporation and the acquisition of the FIM image one or more times.

13. The ion beam device according to claim 12, wherein the second temperature is higher than the first temperature and lower than the operation limit temperature of the emitter tip capable of acquiring the FIM image.

14. The ion beam device according to claim 13, wherein a difference between the operation limit temperature of the emitter tip capable of acquiring the FIM image and the first temperature is within 40 K.

15. The ion beam device according to claim 12, wherein the FIM image is a two-dimensional image formed by scanning the ion beam on a diaphragm by a deflector, detecting the intensity of the ion beam transmitted through the diaphragm, and associating the scan position and the intensity of the transmitted ion beam, and is obtained by making the spread of a component emitted from an arbitrary atom of the emitter tip in the ion beam larger than the aperture of the diaphragm.

16. The ion beam device according to claim 11, wherein the configuration and relative arrangement of facets in an apex portion of the emitter tip are formed by heating to a third temperature which is higher than room temperature.

17. The ion beam device according to claim 11, wherein the first temperature is lower than the boiling point of liquid nitrogen.

18. The ion beam device according to claim 11, wherein while field evaporating the atoms at the apex of the emitter tip at the second temperature, the pressure of the gas is set to a second pressure which is higher than the first pressure.

19. The ion beam device according to claim 11, wherein the main component of the gas is helium, and the first temperature is 60 K or lower, and the second temperature is 60 K or higher and lower than 100 K.

20. The ion beam device according to claim 11, wherein the main component of the gas is hydrogen, and the first temperature is 50 K or lower, and the second temperature is 50 K or higher and lower than 120 K.

* * * * *